United States Patent
Nam et al.

(10) Patent No.: US 11,631,774 B2
(45) Date of Patent: Apr. 18, 2023

(54) SUBSTRATE FOR SOLAR CELL AND MANUFACTURING METHOD THEREOF

(71) Applicant: RESEARCH & BUSINESS FOUNDATION SUNGKYUNKWAN UNIVERSITY, Suwon-si (KR)

(72) Inventors: Jae Do Nam, Seoul (KR); Jun Young Kim, Suwon-si (KR); Ui Seok Hwang, Seoul (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 17/688,097

(22) Filed: Mar. 7, 2022

(65) Prior Publication Data

US 2022/0359773 A1 Nov. 10, 2022

(30) Foreign Application Priority Data

Mar. 9, 2021 (KR) .......................... 10-2021-0030630

(51) Int. Cl.
- *H01L 31/0224* (2006.01)
- *H01L 31/18* (2006.01)
- *C25D 13/04* (2006.01)
- *C25D 17/12* (2006.01)

(52) U.S. Cl.
CPC ...... *H01L 31/022425* (2013.01); *C25D 13/04* (2013.01); *C25D 17/12* (2013.01); *H01L 31/18* (2013.01); *H01L 31/022466* (2013.01)

(58) Field of Classification Search
None
See application file for complete search history.

(56) References Cited

U.S. PATENT DOCUMENTS

| | | | | |
|---|---|---|---|---|
| 1,589,327 A | * | 6/1926 | Eberlin | ................ C25D 13/04 106/162.7 |
| 2016/0108537 A1 | * | 4/2016 | Hamad | ..................... C08J 5/18 204/471 |

FOREIGN PATENT DOCUMENTS

| | | |
|---|---|---|
| JP | 2007-71608 A | 3/2007 |
| JP | 2015-525284 A | 9/2015 |
| JP | 2017-48293 A | 3/2017 |

OTHER PUBLICATIONS

8. Chen et al Colloids and Surfaces B: Biointerfaces 118 (2014) 41-48 (Year: 2014).*

* cited by examiner

*Primary Examiner* — Louis J Rufo
(74) *Attorney, Agent, or Firm* — NSIP Law

(57) ABSTRACT

Disclosed are a substrate for a solar cell and a method for manufacturing the same. The method include putting negative and positive electrodes facing away from each other into suspension in which at least two different types of negatively charged cellulose nanofibers are dispersed; applying a voltage across the positive and negative electrodes such that the cellulose fibers are adsorbed onto a surface of the negative electrode; and drying the negative electrode having the cellulose fibers adsorbed thereon.

10 Claims, 5 Drawing Sheets

[FIG. 1]
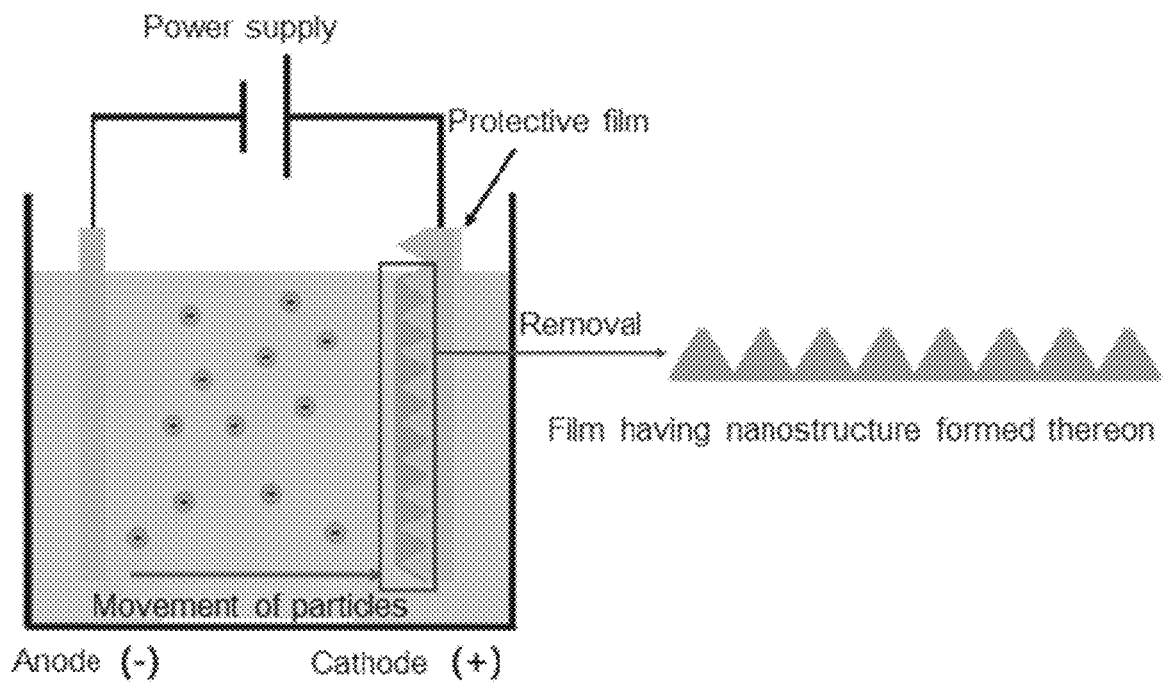
[FIG. 2]
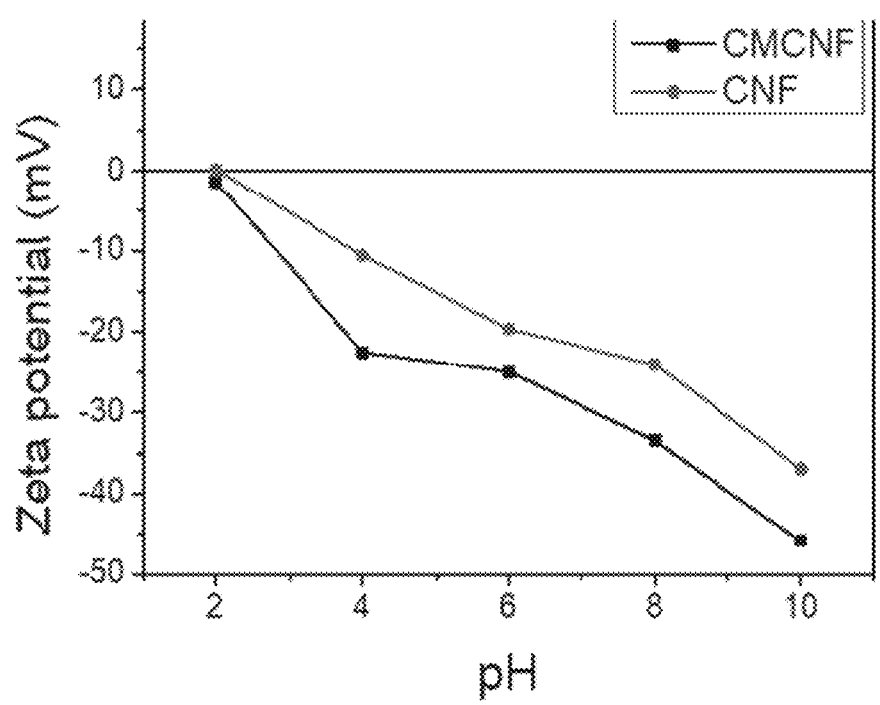

[FIG. 3]
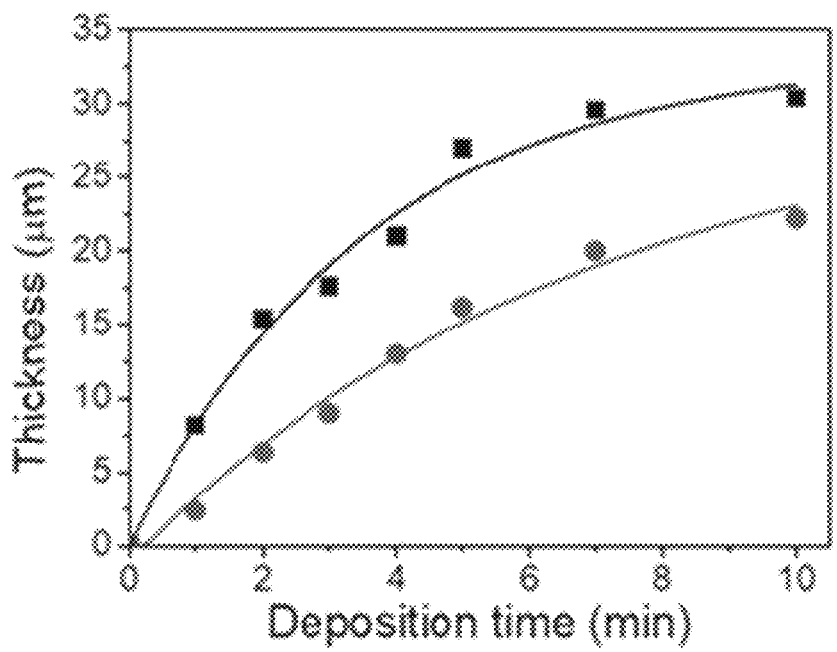
[FIG. 4]
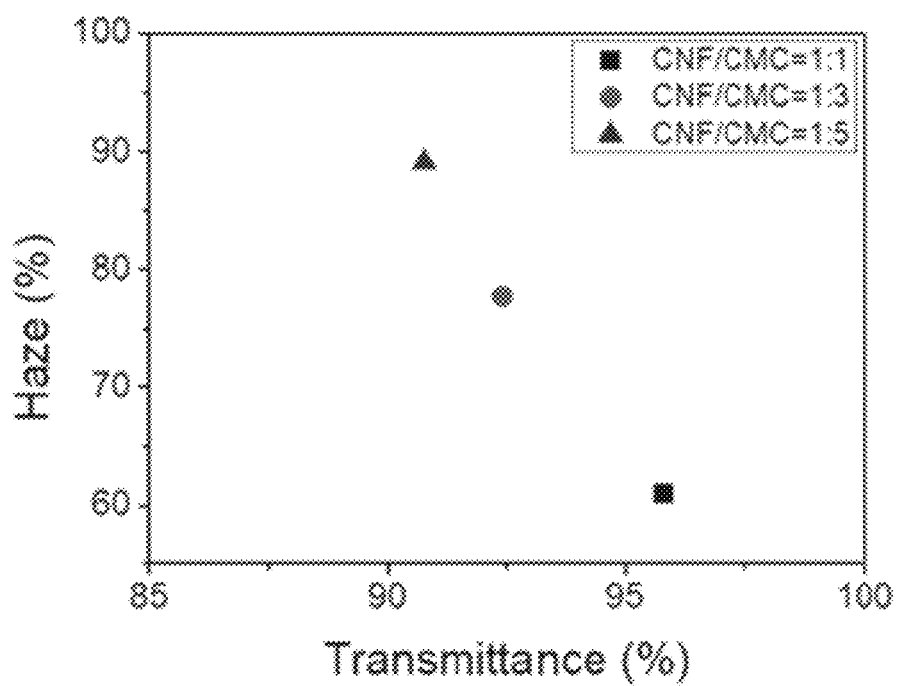

[FIG. 5]
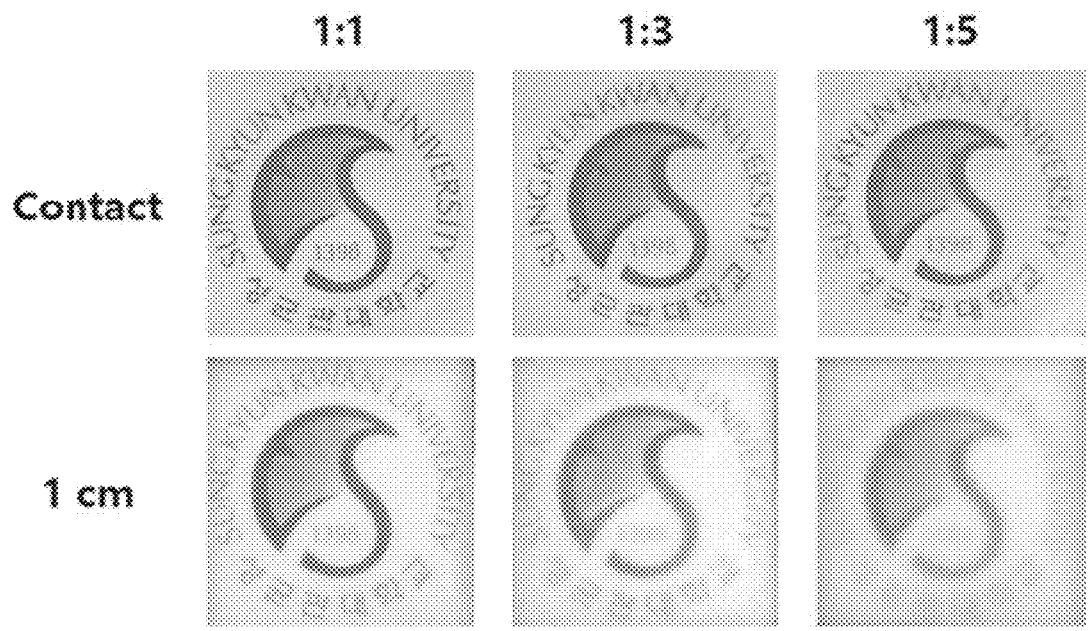
[FIG. 6]
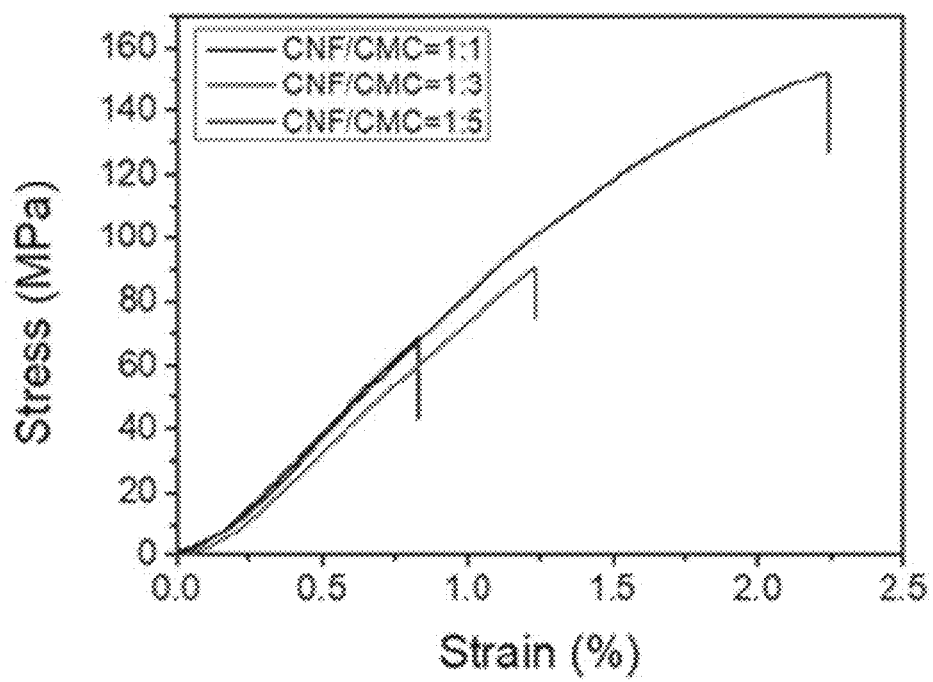

[FIG. 7]
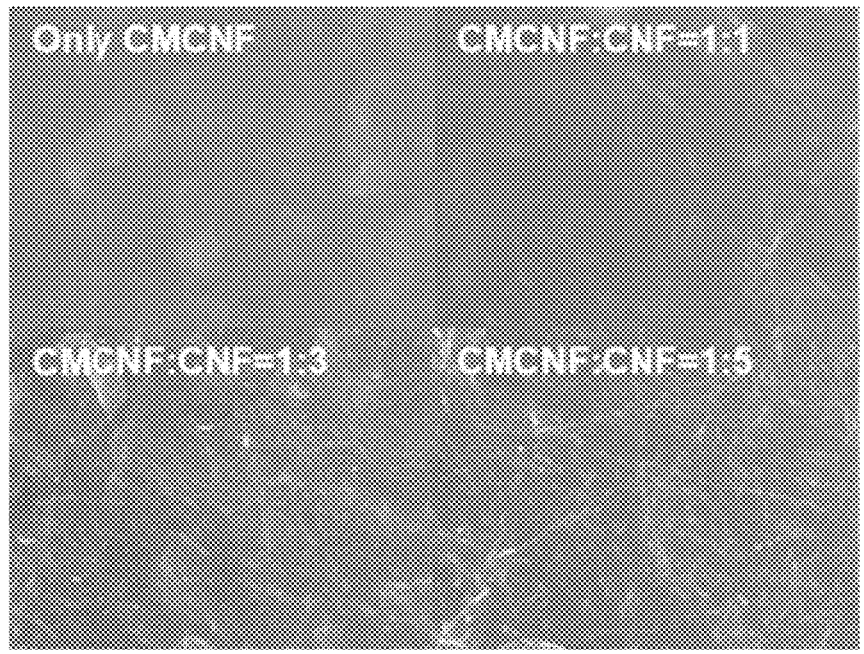
[FIG. 8]
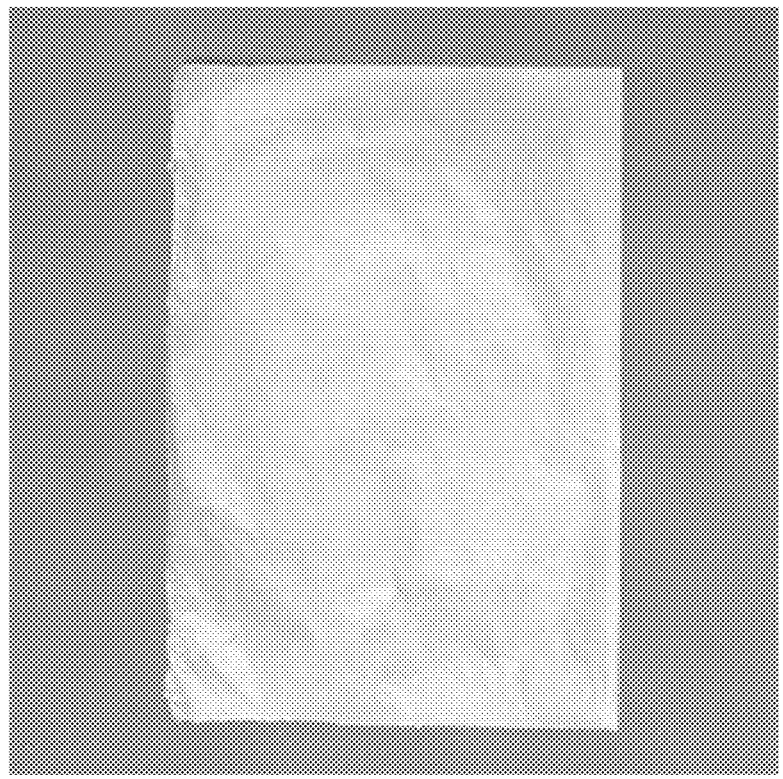

[FIG. 9]
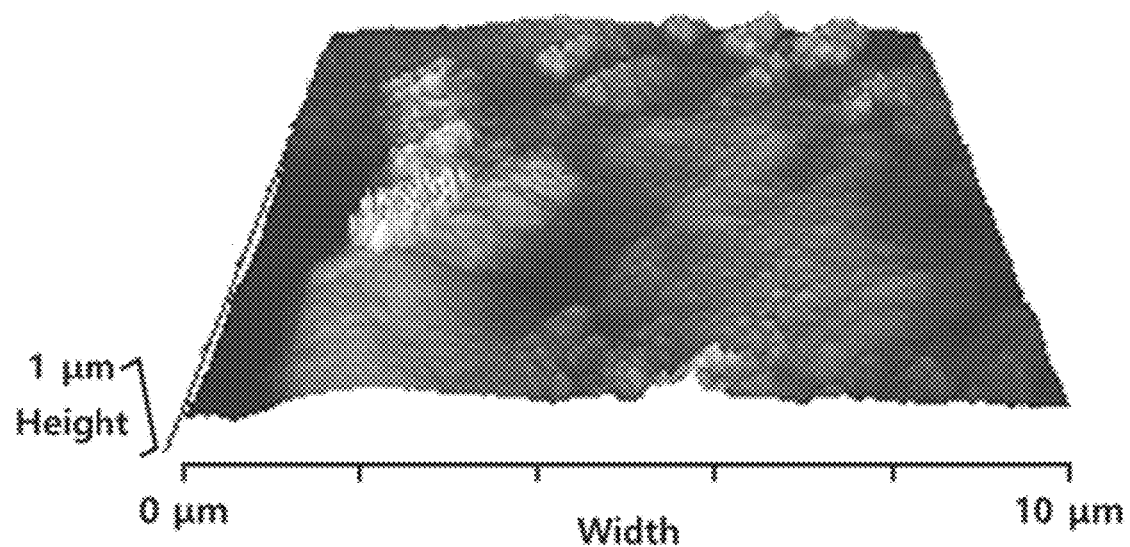

SUBSTRATE FOR SOLAR CELL AND MANUFACTURING METHOD THEREOF

CROSS-REFERENCE TO RELATED APPLICATIONS

This application claims the benefit under 35 USC 119(a) of Korean Patent Application No. 10-2021-0030630 filed on Mar. 9, 2021, in the Korean Intellectual Property Office, the entire disclosure of which is incorporated herein by reference for all purposes.

TECHNICAL FIELD

The present disclosure relates to a substrate for a solar cell and a method for manufacturing the same, and more specifically, to a method for manufacturing a substrate for a solar cell having excellent optical properties in an electrophoretic deposition manner.

BACKGROUND ART OF THE INVENTION

Use of fossil fuels such as oil and coal leads to environmental destruction. Thus, development of eco-friendly energy technology is emerging as a key goal in order to reduce a use amount of the fossil fuels. A solar cell is one of representative eco-friendly energy sources along with wind power generators and nuclear power generators. The solar cell produce energy by utilizing a photoelectric effect that converts light energy into electrical energy. However, efficiency of the solar cells is still around 20%, and thus various studies are being conducted to improve the efficiency.

One of methods of improving the solar cell efficiency is to increase the number of photons (concept that considers light as particles) reaching an active material. This scheme may be achieved 1) by using a material with high transmittance or 2) by scattering light to increase a moving distance thereof. This is because, when the transmittance is high, the larger number of photons may pass through the material, and when the moving distance of light is increased, an absorption depth increases and thus the number of photons reaching the active material increases.

In this regard, the movement distance of light increases as the scattering becomes more severe. In the solar cells, this may be solved by 1) using a substrate with high haze, or 2) using a substrate having nanostructures implemented on a surface thereof. However, in general, the haze and the transmittance have a trade-off relationship, so that there are many limitations in achieving high haze and high transmittance at the same time. For example, a surface shape of a polymer material such as polycarbonate or polyimide or silicon which is currently mainly used as a substrate for the solar cell is formed into a nanostructure such as a nanocone to induce the light scattering. Alternatively, metal nano particles are deposited on the surface of the substrate to spread the light. However, this requires high technology and energy, and causes various problems such as an increase in a weight of the substrate and an increase in a cost of a battery, and environmental pollution, and causes negative effects.

In order to solve this problem, research for using cellulose as a material of the substrate for a solar cell is being actively conducted in recent years. Cellulose is the most abundant organic compound on the planet, and has excellent thermal and mechanical properties due to β(1-4)-glycosidic bonds composed of D-glucose units and hydrogen bonding between hydroxyl groups in cellulose. Thus, the cellulose is attracting a lot of attention as an eco-friendly material to enhance physical properties or replace existing materials in various fields such as cosmetics, pharmaceutical packaging, displays and solar cells, and battery separators.

However, conventional methods such as vacuum filtration or solvent casting, for producing a film using cellulose nanofibrils control the cellulose nanofibrils in a bulky manner, and thus produce a relatively thicker film having a thickness of several tens of gm and has a limitation in finely controlling the thickness.

Further, in a drying process, an additional compression process for film formation is required, or a time and energy consumed in the drying process that requires a time exceeding 24 hours are significant and utilization thereof is not high. In addition, since there is no method to control a surface of the film, it is impossible to implement various types of nanostructures.

DESCRIPTION

Challenge to Solve

One purpose of the present disclosure is to solve the conventional problems, and thus is to provide a method for manufacturing a substrate for a solar cell that may control a thickness in an electrophoretic deposition manner and implement a complex nanostructure on a surface without additional energy consumption.

Another purpose of the present disclosure is to provide a substrate for a solar cell which is environmentally friendly and has excellent transmittance and haze.

Another purpose of the present disclosure is to provide a solar cell including the substrate for the solar cell as an upper substrate.

Solution to the Problem

A first aspect of the present disclosure provides a method for manufacturing a substrate for a solar cell, the method comprising: putting negative and positive electrodes facing away from each other into suspension in which at least two different types of negatively charged cellulose nanofibers are dispersed; applying a voltage across the positive and negative electrodes such that the cellulose fibers are adsorbed onto a surface of the negative electrode; and drying the negative electrode having the cellulose fibers adsorbed thereon.

In one implementation of the method, the negative electrode has: a nanostructure formed on a front surface thereof facing the positive electrode; and an insulating film covering a surface of the negative electrode in a remaining area except for the front surface.

In one implementation of the method, the insulating film includes at least one selected from a group consisting of polyimide, polyethylene, polypropylene, polyester, nylon, cellophane, polyvinyl chloride, polycarbonate, polyethylene terephthalate and silicon.

In one implementation of the method, the cellulose fiber is adsorbed to the front surface of the negative electrode, wherein a nanostructure corresponding to the nanostructure formed on the front surface is formed on a surface of the substrate.

In one implementation of the method, the suspension contains nanocellulose (CNF) and carboxymethylcellulose (CMCNF), wherein the suspension contains 100 to 500 parts by weight of nanocellulose (CNF) based on 100 parts by weight of carboxymethylcellulose (CMCNF).

In one implementation of the method, the suspension is prepared by: mixing first suspension including carboxymethylcellulose (CMCNF) with second suspension including nanocellulose (CNF) to produce a mixed solution; and stirring and sonicating the mixed solution.

In one implementation of the method, the first suspension and the second suspension are mixed with each other in a volume ratio in a range of 1:1 to 1:5.

In one implementation of the method, the stirring is performed for 30 minutes to 2 hours, and the sonication is performed for 1 hour to 6 hours and at 100 W to 500 W.

In one implementation of the method, the voltage is applied at 3 to 7 V and for 3 to 7 minutes.

In one implementation of the method, the drying is performed for 2 to 6 hours and using hot air.

In one implementation of the method, a spacing between the negative electrode and the positive electrode is in a range of 1 to 5 cm.

A second aspect of the present disclosure provides a substrate for a solar cell, wherein the substrate is made of a complex of carboxymethylcellulose (CMCNF) and nanocellulose (CNF), wherein the substrate has a formed on a surface thereof, wherein the nanostructure includes at least one selected from a group consisting of a pyramid-shaped nano-protrusion, an inverted-pyramid-shaped nano-protrusion, a zigzag-shaped linear nano-protrusion, a nanocone-shaped nanb-protrusion, a nanorod-shaped nano-protrusion, a needle-shaped nano-protrusion, and a sphere-shaped nano-protrusion.

In one implementation of the substrate, a thickness of the substrate is in a range of 2 to 30 μm.

A third aspect of the present disclosure provides a solar cell comprising: upper and lower substrates spaced apart from each other; a light absorption layer disposed between the upper substrate and the lower substrate; a first electrode disposed between the upper substrate and the light absorption layer; and a second electrode disposed between the lower substrate and the light absorption layer, wherein the upper substrate to which sunlight is incident includes the substrate for the solar cell as described above.

In one implementation of the solar cell, a thickness of the upper substrate is in a range of 2 to 30 μm.

Effects of the Invention

The method according to the present disclosure manufactures the substrate in the electrophoretic deposition manner using the suspension in which at least two types of negatively charged cellulose nanofibers are dispersed. Thus, energy consumption and the number of devices as required are significantly reduced, compared to the conventional method such as vacuum filtration or solvent casting. In addition, the method may adjust various variables such as the distance between the electrodes, the viscosity of the suspension, and the magnitude of the voltage during the electrophoretic deposition such that the behavior of the cellulose fiber may be precisely controlled, so that the thickness of the substrate may be variously adjusted.

Further, according to the present disclosure, when the electrophoretic deposition is performed using the negative electrode having the nanostructure formed on a front surface facing away the positive electrode, a complex nanostructure may be implemented on the surface of the substrate without additional energy consumption. Therefore, the substrate according to the present disclosure may further maximize light scattering due to the presence of the nanostructure.

In addition, in accordance with the present disclosure, in order to prevent adsorption of the cellulose fibers onto an entire area of the negative electrode and to allow the cellulose fibers to be adsorbed only to the front surface thereof, the negative electrode may have the insulating film covering a surface thereof in a remaining area except for the front surface thereof. Due to the presence of the insulating film, the method of the present disclosure may prevent material waste, may not require an additional cutting process for shaping the substrate, and may prevent difficulties that may occur in the process of detaching the substrate from the electrode after the drying.

The substrate for the solar cell as manufactured using the method according to the present disclosure may achieve high transmittance and high haze at the same time due to the unique optical properties of the cellulose nanofiber material without mixing additional materials thereto. Further, the substrate for the solar cell may have excellent mechanical properties and thus have high stability and thus may be used not only as the substrate for the solar cell but also in various optoelectronic fields.

In addition to the effects as described above, specific effects in accordance with the present disclosure will be described together with following detailed descriptions for carrying out the disclosure.

BRIEF DESCRIPTION OF DRAWINGS

FIG. 1 is a schematic diagram showing a method for manufacturing a substrate for a solar cell according to an embodiment of the present disclosure.

FIG. 2 shows a result of measuring a zeta potential to predict behavior of each of nanocellulose (CNF) suspension and carboxymethylcellulose (CMCNF) suspension when performing electrophoretic deposition (EPD).

FIG. 3 shows a result of measuring change in a thickness of a substrate for a solar cell based on voltage and adsorption time when electrophoretic deposition (EPD) is performed at each of 3 V and 4 V using suspension according to Present Example 2.

FIG. 4 shows transmittance and haze measurement results in a 550 nm wavelength region of a substrate for a solar cell manufactured according to each of Present Examples 1 to 3.

FIG. 5 shows observation results when the substrate for the solar cell of each of Present Examples 1 to 3 contacts a material on which a pattern is printed or is spaced therefrom by 1 cm spacing in order to identify transmittance of the substrate for the solar cell manufactured based on each of Present Examples 1 to 3.

FIG. 6 shows a stress-strain curve of the substrate for the solar cell manufactured based on each of Present Examples 1 to 3.

FIG. 7 shows a SEM image of the substrate for the solar cell manufactured according to each of Present Examples 1 to 3, and Comparative Example 1.

FIG. 8 is an image of a substrate for a solar cell manufactured according to Present Example 2.

FIG. 9 shows an atomic force microscope (AFM) image of a surface of the substrate for the solar cell manufactured according to Present Example 2.

DETAILED DESCRIPTION FOR INVENTION'S IMPLEMENT

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram showing a method for manufacturing a substrate for a solar cell according to an embodiment of the present disclosure.

Referring to FIG. 1, a method for manufacturing a substrate for a solar cell according to the present disclosure may include putting a negative electrode and a positive electrode facing away the negative electrode into suspension in which at least two different types of negatively charged cellulose nanofibers are dispersed, and then applying voltage across the positive and negative electrodes such that the cellulose fibers are adsorbed onto a surface of the negative electrode in S110, and drying the negative electrode onto which the cellulose fibers are adsorbed in S120.

First, the method for manufacturing the substrate for the solar cell according to the present disclosure performs putting a negative electrode and a positive electrode facing away the negative electrode into suspension in which at least two different types of negatively charged cellulose nanofibers are dispersed, and then applying voltage across the positive and negative electrodes such that the cellulose fibers are adsorbed onto a surface of the negative electrode (S110).

The cellulose nanofiber used in the present disclosure have unique optical properties along with excellent physical properties due to hydrogen bonding. A general cellulose nanofiber has a refractive index of about 1.54 which has a significant difference from that of air, that is, 1.00, and thus scatters light very well. A cellulose nanofiber having a nano sized diameter also has the property of transmitting light therethrough due to the diameter smaller than a wavelength of visible light. Thus, a substrate composed of the cellulose nanofibers may possess unique optical properties having high transmittance and high haze at the same time.

Further, the cellulose nanofiber used in the present disclosure has a hydroxyl group, and thus has a negative charge. Therefore, when the negative electrode and the positive electrode facing away the negative electrode are put into the suspension in which at least two different types of negatively charged cellulose nanofibers are dispersed, and the voltage is generated between the positive and negative electrodes, the cellulose fibers may move due to electrical energy. Thus, since all the cellulose nanofibers are negatively charged, the cellulose nanofibers are adsorbed to the negative electrode.

In this regard, in the step S110, a weight of the cellulose fibers adsorbed to a unit area of the negative electrode may be calculated using a following Equation 1.

$$\omega = \frac{2}{3} C \cdot \epsilon_0 \cdot \epsilon_r \cdot \xi \cdot \left(\frac{1}{\eta}\right) \cdot \left(\frac{E}{L}\right) \cdot t$$

In the above Equation 1, C denotes a concentration of the cellulose fiber, $\epsilon_0$ denotes permittivity of a vacuum, $\epsilon_r$ denotes relative permittivity of a solvent, $\xi$ denotes a surface charge of the cellulose fiber, $\eta$ denotes viscosity of a solution, E denotes applied electrical potential, L denotes a distance between the electrodes, and t denotes an adsorption time. These variables may be controlled to control an amount of the cellulose fibers adsorbed to the negative electrode to adjust a thickness of the manufactured substrate.

In one example, the method according to the present disclosure may control physical properties of the substrate using the suspension in which the at least two different types of negatively charged cellulose nanofibers are dispersed.

In one embodiment, carboxymethylcellulose (CMCNF) and nanocellulose (CNF) may be dispersed in the suspension. Preferably, the suspension may contain 100 to 500 parts by weight of nanocellulose (CNF) based on 100 parts by weight of carboxymethylcellulose (CMCNF). However, the disclosure is not limited thereto. The suspension may contain carboxymethylcellulose (CMCNF) and nanocellulose (CNF) in various ratios to achieve required physical properties of the substrate.

In one embodiment, the suspension may be prepared by mixing a first suspension including carboxymethylcellulose (CMCNF) and a second suspension including nanocellulose (CNF) with each other and stirring and sonicating the mixture. In this regard, the first suspension and the second suspension may be preferably mixed with each other in a volume ratio of 1:1 to 1:5. However, the disclosure is not limited thereto. The first suspension and the second suspension may be mixed with each other in various ratios to achieve the required physical properties of the substrate.

In one embodiment, the stirring may be performed for 30 minutes to 2 hours. Further, the sonication causes pulverization effect of the cellulose fibers, and may preferably be performed at 100 W to 500 W for 1 hour to 6 hours.

The cellulose nanofibers according to the present disclosure are adsorbed along and on a surface structure of the negative electrode. Therefore, when the negative electrode having a nanostructure is used, a complex nanostructure may be implemented on the surface of the substrate for a solar cell without additional energy consumption.

Accordingly, the negative electrode according to the present disclosure may have a nanostructure formed on a front surface thereof facing the positive electrode. The nanostructure is not particularly limited. The nanostructure may include, for example, a pyramid-shaped nano-protrusion, an inverted-pyramid-shaped nano-protrusion, a zigzag-shaped linear nano-protrusion, a nanocone-shaped nano-protrusion, a nanorod-shaped nano-protrusion, a needle-shaped nano-structure, and a spherical nano protrusion.

Further, in the step S110, in order to prevent adsorption of the cellulose fibers onto an entire area of the negative electrode and to allow the cellulose fibers to be adsorbed only to the front surface thereof, the negative electrode may have an insulating film covering a surface thereof in a remaining area except for the front surface. Due to the presence of the insulating film, the method of the present disclosure may prevent material waste, may not require an additional cutting process for shaping the substrate, and may prevent problems occurring in a process of detaching the substrate after the step S120.

In one embodiment, the insulating film may be made of an insulating coating agent including silicon or a polymer material such as polyimide, polyethylene, polypropylene, polyester, nylon, cellophane, polyvinyl chloride, polycarbonate, polyethylene terephthalate, etc. The insulating material may be made of a material that may be adsorbed to the electrode and may suppress generation of an electric field. A thickness of the insulating film may be preferably at least 0.1 μm or larger and 5 mm or smaller for easiness in handling the electrode.

As described above, due to the nanostructure and the insulating film of the negative electrode, a nanostructure corresponding to the nanostructure formed on the front surface of the negative electrode may be formed on a surface of the substrate for the solar cell according to the present disclosure.

In one example, according to the present disclosure, as described above, the thickness of the substrate may be controlled by controlling a magnitude of the voltage, the distance between the negative electrode and the positive electrode, and the like.

In an embodiment, in the step S110, the voltage as applied may be in a range of 3 to 7 V, preferably 3 to 5 V. When a voltage lower than 3 V is applied, the adsorption itself may not occur in a uniform manner due to insufficient force for adsorption of the cellulose fibers. When a voltage exceeding 7 V is applied, the cellulose fibers may be adsorbed in a too thick and non-uniform manner for a short period of time. Further, the voltage has considerable difference from 1.23 V as a voltage at which water is electrolyzed, thereby causing air bubbles to occur, resulting in quality deterioration of the finally manufactured substrate.

Further, the voltage application in the step S110 is preferably performed for 3 to 7 minutes. When the voltage application is carried out for smaller than 3 minutes, the amount of cellulose fibers adsorbed to the electrode decreases significantly, causing insufficient formation of the substrate after the drying. That is, a thickness of the resulting substate is very small such that the substrate is not removed from the electrode. When the application time exceeds 7 minutes, a larger amount of the cellulose fibers is deposited on the negative electrode, such that a cost is high.

In one embodiment, in the step S110, the distance between the negative electrode and the positive electrode may be preferably in a range of 1 to 5 cm. When the distance between the negative and positive electrodes is out of the above range, there is a problem in that the voltage must be greatly increased.

In one example, the negative electrode according to the present disclosure may be made of a conductive material such as a graphene film and carbon nanofiber as well as a metal such as aluminum, copper, and brass. Further, for example, a size of an area of the electrode may be 1 cm×1 cm or greater so that detachment may be easily performed or may freely vary based on a size of the substrate to be manufactured.

Next, the step S120 of drying the negative electrode to which the cellulose fibers are adsorbed is performed.

In the step S120, the negative electrode to which the cellulose fibers are adsorbed may be dried to remove a dispersing medium. Thus, the cellulose fibers may be converted into a form of a substrate.

In one embodiment, the step S120 may he performed in a hot air drying manner and for 2 to 6 hours, preferably for 3 to 5 hours. When the drying is performed for larger than 6 hours, a cost increases. When the drying duration is smaller than 2 hours, an imperfect substrate may occur due to the remaining solvent that has not been dried.

According to the present disclosure, the drying time is significantly reduced compared to a conventional hot air drying that takes at least 12 hours or longer, 24 hours or longer, thereby significantly improving the productivity of the process.

Further, after the step S120 according to the present disclosure, detachment of the substrate as manufactured from the front surface of the electrode is physically easy.

The method of the present disclosure manufactures the substrate in the electrophoretic deposition manner using the suspension in which at least two types of negatively charged cellulose nanofibers are dispersed. Thus, energy consumption and the number of devices as required are significantly reduced, compared to the conventional method such as vacuum filtration or solvent casting. In addition, the method may adjust various variables such as the distance between the electrodes, the viscosity of the suspension, and the magnitude of the voltage during the electrophoretic deposition such that the behavior of the cellulose fiber may be precisely controlled, so that the thickness of the substrate may be variously adjusted.

Further, according to the present disclosure, when the electrophoretic deposition is performed using the negative electrode having the nanostructure formed on a front surface facing away the positive electrode, a complex nanostructure may be implemented on the surface of the substrate without additional energy consumption. Therefore, the substrate according to the present disclosure may further maximize light scattering due to the presence of the nanostructure.

In addition, in accordance with the present disclosure, in order to prevent adsorption of the cellulose fibers onto an entire area of the negative electrode and to allow the cellulose fibers to be adsorbed only to the front surface thereof, the negative electrode may have the insulating film covering a surface thereof in a remaining area except for the front surface thereof. Due to the presence of the insulating film, the method of the present disclosure may prevent material waste, may not require an additional cutting process for shaping the substrate, and may prevent difficulties that may occur in the process of detaching the substrate from the electrode after the drying.

In one example, another aspect of the present disclosure provides a substrate for a solar cell in which the substrate is made of a complex of carboxymethylcellulose (CMCNF) and nanocellulose (CNF), wherein any one nanostructure selected from a pyramid-shaped nano-protrusion, inverted-pyramid-shaped nano-protrusion, a zigzag-shaped linear nano-protrusion, a nanocone-shaped nano-protrusion, a nanorod-shaped nano-protrusion, a needle-shaped nanostructure, and a spherical nano-protrusion is formed on a surface of the substrate.

In one embodiment, the nanostructure may include a modified nanostructure having a shape other than the above-described shape.

In one embodiment, a thickness of the substrate for the solar cell may be in a range of 2 to 30 μm.

The substrate for the solar cell may achieve high transmittance and high haze at the same time due to the unique optical properties of the cellulose nanofiber material without mixing additional materials thereto. Further, the substrate for the solar cell may have excellent mechanical properties and thus have high stability and thus may be used not only as the substrate for the solar cell but also in various optoelectronic fields.

In one example, another aspect of the present disclosure may provide a solar cell including the substrate for the solar cell as described above.

The solar cell may include an upper substrate and a lower substrate spaced apart from each other, a light absorption layer disposed between the lower substrate and the lower substrate, a first electrode disposed between the upper substrate and the light absorption layer, and a second electrode disposed between the lower substrate and the light absorption layer, wherein the upper substrate on which sunlight is incident may include the substrate for the solar cell as described above. Thus, the substrate may induce increased scattering of the light, thereby improving the efficiency of the solar cell.

In one embodiment, a thickness of the upper substrate may be in a range of 2 to 30 μm. Further, in addition to the above-described configuration, the solar cell may further include other known configurations.

Hereinafter, the substrate for the solar cell according to the present disclosure and the method for manufacturing the same will be described in detail based on Examples.

Present Example 1

Each of first suspension including carboxymethylcellulose (CMCNF) at 0.5% by weight and second suspension including nanocellulose (CNF) at 0.5% by weight were prepared. The first suspension and second suspensions were mixed with each other at a ratio of 1:1 (v/v), and the mixture was stirred for 1 hour, and then dispersed via ultrasonication for 1 hour using an ultrasonic disperser.

Next, a negative electrode made of brass and a positive electrode made of stainless steel were input into an electrophoretic deposition bath containing the mixed suspension therein such that a spacing between the electrodes was 1 cm. In this regard, the negative electrode had the nanostructure formed on the front face thereof facing the positive electrode. Further, the insulating film was attached to an area of the brass except for the front face to prevent adsorption of the cellulose to the area.

Thereafter, a voltage of 3 V was applied to the electrode for 3 minutes to move and adsorb the negatively charged celluloses to the brass negative electrode, followed by hot air drying at 60° C. for 4 hours. The cellulose adsorbed thereon was converted into a substrate via the hot air drying. The electrode having the cellulose adsorbed thereon was taken out of the electrophoretic deposition bath. Then, the substrate adsorbed on the front face was easily removed physically therefrom to obtain a self-standing substrate for a solar cell.

Present Example 2

A substrate for a solar cell was manufactured in the same manner as in Present Example 1, except that a mixing ratio of the first suspension and the second suspension was 1:3 (v/v).

Present Example 3

A substrate for a solar cell was manufactured in the same manner as in Present Example 1, except that a mixing ratio of the first suspension and the second suspension was 1:5 (v/v).

Comparative Example 1

A substrate for a solar cell was manufactured in the same manner as in Present Example 1, except that only the first suspension (CMCNF) was used.

Physical property evaluation

Experimental Example 1

A zeta potential was measured to predict the behavior of each of the nanocellulose (CNF) suspension and the carboxymethylcellulose (CMCNF) suspension during the electrophoretic deposition (EPD). The results are shown in FIG. 2.

Referring to FIG. 2, both the nanocellulose (CNF) suspension and the carboxymethylcellulose (CMCNF) suspension exhibited a negative zeta potential. This means that when performing the electrophoretic deposition by applying the voltage to the electrodes, the nanocellulose moves toward the negative electrode.

Experimental Example 2

When electrophoretic deposition (EPD) is performed at each of 3 V and 4 V using the suspension prepared in Present Example 2 in which nanocellulose (CNF) and carboxymethylcellulose (CMCNF) were mixed with each other in a 3:1 (v/v) ratio, change in a thickness of the substrate for the solar cell based on the voltage and the adsorption time was measured. The result is shown in FIG. 3.

As shown in FIG. 3, it was identified that as the voltage and the adsorption time increased, the amount of the adsorbed cellulose fibers increased and thus the thickness of the substrate increased. This result indicates that the method according to the present disclosure may control the thickness of the substrate by controlling the voltage and the adsorption time.

Experimental Example 3

To identify the transmittance and the haze of the substrate for the solar cell manufactured through each of Present Examples 1 to 3, the transmittance and the haze of the substrate for the solar cell were measured in a 550 nm wavelength region, and the results are shown in FIG. 4 and a following Table 1.

TABLE 1

|  | Present Example 1 (CMCNF: CNF = 1:1) | Present Example 2 (CMCNF: CNF = 1:3) | Present Example 3 (CMCNF: CNF = 1:5) |
| --- | --- | --- | --- |
| 550 nm region transmittance (%) | 95.78 | 92.41 | 90.75 |
| 550 nm region haze (%) | 61.02 | 77.78 | 89.16 |

Referring to Table 1 and FIG. 4, it may be identified that as a content of nanocellulose (CNF) increases, the light transmittance decreases, while the haze increases.

Further, the substrates for the solar cell according to an embodiment of the present disclosure exhibited excellent transmittance and haze in that the transmittance was 90% or higher and the haze was 60% or higher.

Experimental Example 4

To identify the transmittance of the substrate for the solar cell manufactured according to each of Present Examples 1 to 3, the substrate for the solar cell of each of Present Examples 1 to 3 contacted a material on which a pattern was printed and then the substrate was spaced from the material by a 1cm spacing. The results are shown in FIG. 5.

As shown in FIG. 5, it may be identified that when the substrate for the solar cell of each of Present Examples 1 to 3 of the present disclosure contacts the material, the pattern is clearly visible due to high transmittance thereof. When the substrate is spaced from the material, the pattern is blurred due to the high haze thereof.

Further, it may be identified that due to the increase in the haze as the content of nanocellulose (CNF) increases, visibility of the pattern decreases as the example goes from Present Example 1 to Present Example 3.

Experimental Example 5

Mechanical properties (tensile strength and elongation) of the substrate for the solar cells manufactured through each of Present Examples 1 to 3 were measured, and a stress-strain curve is shown in FIG. 6.

Referring to FIG. 6, it may be identified that as the content of nanocellulose (CNF) increases, mechanical properties are improved, thereby increasing the tensile strength and the elongation.

Experimental Example 6

In order to observe the structural change of the substrate for the solar cell based on the content of nanocellulose (CNF), the substrate for the solar cell manufactured according to each of Present Examples 1 to 3 and Comparative Example 1 was observed using a scanning electron microscope (SEM).

FIG. 7 shows SEM images of the substrates for solar cells manufactured according to Present Examples 1 to 3, and Comparative Example 1.

Referring to FIG. 7, in Comparative Example 1 in which only CMCNF is present has a smooth surface due to characteristic of CMCNF which gels well. In Present Examples 1 to 3 in which nanocellulose (CNF) and CMCNF were mixed with each other, a form of a fibril appears on a surface of the substrate. As the content of nanocellulose (CNF) increases, the form of the fibrils found on the surface increases.

Experimental Example 7

A substrate for a solar cell manufactured according to Present Example 2 is shown in FIG. 8. Referring to FIG. 8, it may be identified that the substrate for the solar cell according to the present disclosure is capable of self-standing.

Further, a surface of the substrate for the solar cell manufactured according to Present Example 2 was measured using an atomic force microscope (AFM) to identify the nanostructures formed on the surface thereof.

Referring to FIG. 9, it may be identified that a nanostructure corresponding to the nanostructure of the surface of the metal electrode used at the time of manufacturing the substrate was formed on the surface of the substrate for the solar cell. That is, according to the present disclosure, when the electrode having the surface having a nanostructure such as a nanorod or a nanocone is used, a substrate for a solar cell having a corresponding nanostructured surface may be manufactured.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The invention claimed is:

1. A method for manufacturing a substrate for a solar cell, the method comprising:
   putting negative and positive electrodes facing away from each other into suspension in which at least two different types of negatively charged cellulose nanofibers are dispersed;
   applying a voltage across the positive and negative electrodes such that the cellulose fibers are adsorbed onto a surface of the negative electrode; and
   drying the negative electrode having the cellulose fibers adsorbed thereon, wherein the negative electrode has:
a nanostructure formed on a front surface thereof facing the positive electrode; and
an insulating film covering a surface of the negative electrode in a remaining area except for the front surface.

2. The method of claim 1, wherein the insulating film includes at least one selected from a group consisting of polyimide, polyethylene, polypropylene, polyester, nylon, cellophane, polyvinyl chloride, polycarbonate, polyethylene terephthalate and silicon.

3. The method of claim 1, wherein the cellulose fiber is adsorbed to the front surface of the negative electrode,
wherein a nanostructure corresponding to the nanostructure formed on the front surface is formed on a surface of the substrate.

4. The method of claim 1, wherein the suspension contains nanocellulose (CNF) and carboxymethylcellulose (CMCNF),
wherein the suspension contains 100 to 500 parts by weight of nanocellulose (CNF) based on 100 parts by weight of carboxymethylcellulose (CMCNF).

5. A method for manufacturing a substrate for a solar cell, the method comprising:
putting negative and positive electrodes facing away from each other into suspension in which at least two different types of negatively charged cellulose nanofibers are dispersed;
applying a voltage across the positive and negative electrodes such that the cellulose fibers are adsorbed onto a surface of the negative electrode; and
drying the negative electrode having the cellulose fibers adsorbed thereon,
wherein the suspension is prepared by:
mixing first suspension including carboxymethylcellulose (CMCNF) with second suspension including nanocellulose (CNF) to produce a mixed solution; and
stirring and sonicating the mixed solution.

6. The method of claim 5, wherein the first suspension and the second suspension are mixed with each other in a volume ratio in a range of 1:1 to 1:5.

7. The method of claim 5, wherein the stirring is performed for 30 minutes to 2 hours, and the sonication is performed for 1 hour to 6 hours and at 100 W to 500 W.

8. The method of claim 5, wherein the voltage is applied at 3 to 7 V and for 3 to 7 minutes.

9. The method of claim 1, wherein the drying is performed for 2 to 6 hours and using hot air.

10. The method of claim 1, wherein a spacing between the negative electrode and the positive electrode is in a range of 1 to 5 cm.

* * * * *